United States Patent [19]

Koike et al.

[11] Patent Number: 4,941,800
[45] Date of Patent: Jul. 17, 1990

[54] TRANSFER APPARATUS FOR PLATE-LIKE MEMBER

[75] Inventors: Hisashi Koike; Itaru Takao; Masaki Narushima; Kiyoshi Takekoshi, all of Yamanashi, Japan

[73] Assignee: Tokyo Electron Limited, Tokyo, Japan

[21] Appl. No.: 260,608

[22] Filed: Oct. 21, 1988

[51] Int. Cl.$^5$ ............................................. B65G 1/00
[52] U.S. Cl. .................................... 414/752; 414/280
[58] Field of Search ............... 414/751, 752, 225, 331, 414/737, 627, 661, 280, 752

[56] References Cited

U.S. PATENT DOCUMENTS

| | | | |
|---|---|---|---|
| 2,672,249 | 3/1954 | Ulinski | 414/661 |
| 4,103,232 | 7/1978 | Sugita et al. | 324/158 F |
| 4,557,659 | 12/1985 | Scaglia | 414/627 |
| 4,561,688 | 12/1985 | Tsutsui | 414/737 X |
| 4,566,726 | 1/1986 | Correnti et al. | 4147/752 X |
| 4,657,470 | 4/1987 | Clarke et al. | 414/752 X |
| 4,777,781 | 10/1988 | Doster et al. | 414/661 X |
| 4,789,295 | 12/1988 | Boucher, Jr. et al. | 414/280 X |
| 4,805,950 | 2/1989 | Haroutel et al. | 414/752 X |

FOREIGN PATENT DOCUMENTS

| | | |
|---|---|---|
| 57-101327 | 6/1982 | Japan . |
| 58-197836 | 11/1983 | Japan . |
| 59-175740 | 10/1984 | Japan . |
| 61-273441 | 3/1986 | Japan . |
| 61-267623 | 11/1986 | Japan . |
| 62-8933 | 1/1987 | Japan . |
| 62-216243 | 9/1987 | Japan . |

*Primary Examiner*—Robert J. Spar
*Assistant Examiner*—John Vanden Bosche
*Attorney, Agent, or Firm*—Oblon, Spivak, McClelland, Maier & Neustadt

[57] ABSTRACT

A transfer apparatus for carrying a semiconductor wafer into a wafer cassette comprising an arm to load a semiconductor wafer thereon, a moving mechanism to move the arm to a wafer cassette, a chucking device to have a wafer attracted to the arm, and an auxiliary mechanism to push a wafer and adjust the position of the wafer to the inlet of a wafer cassette when the wafer comes into contact with the side wall of the wafer cassette.

17 Claims, 3 Drawing Sheets

TRANSFER APPARATUS FOR PLATE-LIKE MEMBER

BACKGROUND OF THE INVENTION

1. Field of the Invention

This invention relates to a transfer apparatus for transferring a plate-like member such as a semiconductor wafer and storing it in a storage body.

2. Description of the Related Art

A well-known example of the transfer apparatuses for transferring semiconductor wafers and storing them in a storage body is one which has been disclosed in Japanese Patent Disclosure No. 84-175740. In this transfer apparatus, a semiconductor wafer that has arrived after passing through the transfer path is loaded on an arm and secured thereto by vacuum chucking. By moving the arm through a wafer cassette as a storage body the semiconductor wafer is transferred to and stored in a predetermined position of the wafer cassette.

Since a semiconductor wafer is transferred while it is loaded on the arm and absorbed thereto, there is a possibility that a wafer is loaded in a position deviating from a predetermined position. As a result, the wafer comes into contact with the side wall of a wafer cassette while the wafer is transferred. When a wafer comes into contact with the side wall of a wafer cassette, it can happen that the wafer becomes unable to move and cannot be stored in the cassette or is broken or is stored in an imperfect way, presenting difficulty in taking out the wafer later on. Another problem is that if the edge of the wafer is broken, there will be resulting fractions of wafer.

SUMMARY OF THE INVENTION

The present invention has been made to solve the above problems and has as its object to provide a transfer apparatus capable of readily carrying a plate material into a storage and securing the plate material in a predetermined position thereof even if the plate material is displaced from a specified position when supported on the transferring arm.

According to an aspect of the present invention, the plate-like member transfer apparatus for transferring a plate-like member into a transferred position having a side wall comprises supporting means for rotatably supporting the plate-like member thereon; moving means for moving the supporting means to the transferred position; and means for causing only the plate-like member to move to a direction to which the plate-like member is transferred by the moving means, thereby adjusting a position of the plate-like member to the transferred position when the plate-like member comes into contact with the side wall of the transferred position.

According to another aspect of the present invention, the plate-like member transfer apparatus for transferring a plate-like member into a transferred position having a side wall comprises supporting means for rotatably supporting a plate material thereon; moving means for moving the supporting means to a transferred position having side wall; and chucking means for holding a plate material on the loading means, the chucking means being capable of reducing the chucking force when a plate material is carried to a neighborhood of the transferred position.

DETAILED DESCRIPTION OF THE PREFERRED EMBODIMENT

With reference to the accompanying drawings, a preferred embodiment of this invention will now be described in detail. This embodiment is a transfer apparatus of semiconductor wafer plates each having a flat orientation and circular semiconductor wafer disks.

Figure 1:
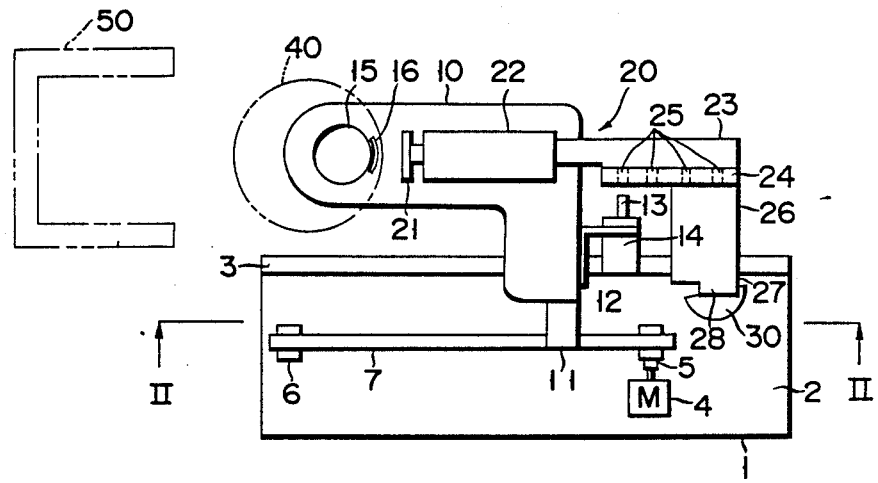
FIG. 1 is a plan view showing the transfer apparatus according to the embodiment of this invention.
Figure 2:
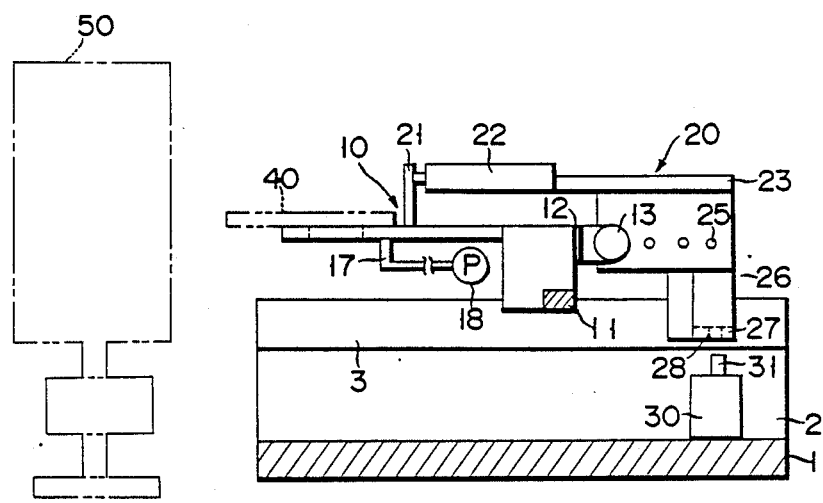
FIG. 2 is a sectional side view taken along line II—II of FIG. 1.

FIG. 1 is a top view of the transfer apparatus according to this invention and FIG. 2 is a sectional side view, taken on line II—II of FIG. 1. Base plate 1 has base plate surface 2, on which linear guide member 3 is mounted in the longitudinal direction thereof. Arm 10 is formed of a L-shaped thin plate and mounted to linear guide member 3 such that arm 10 can move in the longitudinal direction thereof. Arm 10, which receives semiconductor wafer 40 thereon, is moved to wafer cassette 50 (also referred to as a wafer carrier or a wafer stocker) where the wafer is stored. Arm 10 has formed at its end portion hole 15 through which to raise an aligning device and hole 16 for vacuum chucking, as an example of supporting. One end of pipe 17 is connected to hole 16 and the other end is connected to vacuum pump 18. By putting vacuum pump 18 into operation, semiconductor wafer 40 is absorbed to hole 16 of arm 10. In other words, wafer 40 is semifixed by way of arm 10 and hole 16.

Motor 4, driving pulley 5 and driven pulley 6 are secured to base plate surface 2. Driving pulley 5 is connected to the rotating shaft of motor 4. Timing belt 7 is applied on driving pulley 5 and driven pulley 6 and is turned by driving motor 4. End portion 11 of arm 10 is secured to timing belt 7. By the turning of timing belt 7 by motor 4, arm 10 is moved along guide member 3.

Auxiliary mechanism 20 acts as a pushing means, the operation of which will be described later, which pushes semiconductor wafer 40 when semiconductor wafer 40 is carried into cassette 50. Formed in an L shape, auxiliary mechanism 20 comprises pusher plate 21, buffer section 22, middle section 23, connecting member 24 and rear section 26. Connecting member 24 has formed therein a plurality (four in FIGS. 1 and 2) of holes 25. Insertable into holes 25 is pin 13 which acts as a piston rod and comprises air cylinder 14 fixed by support member 12 to the above-mentioned arm 10. When pin 13, which functions as a connecting member is inserted into one of holes 25, a relative movement between auxiliary mechanism 20 and arm 10 is prevented. Since there are provided a plurality of holes into which pin 13 is inserted, the position of auxiliary mechanism 20 can be adjusted corresponding to the size of semiconductor 40.

Rear section 26 has at its end fixing section 27, which has formed therein hole 28. Hole 28 receives pin 31 which acts as a piston rod and comprises air cylinder 30 as a support member, provided on base plate surface 2. As pin 31 is inserted into hole 28, auxiliary mechanism 20 is secured to base plate 1.

More specifically, to make auxiliary mechanism 20 function as a pushing means, pin 13 is inserted into any of holes 25 and auxiliary mechanism 20 is thereby moved with arm 10. When the position of auxiliary mechanism 20 is to be adjusted, pin 31 is inserted into hole 28 and auxiliary mechanism 20 is thereby fixed to base plate 1.

Figure 3:
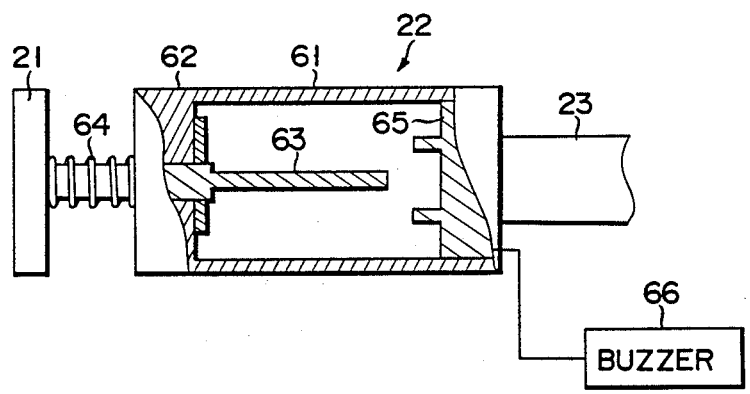
FIG. 3 is a side elevation view, partially in cross section, of the buffer section of the auxiliary mechanism.

As shown in FIG. 3, buffer section 22 comprises main body 61, block 62 provided at the front end of main body 61 and having a horizontal hole in its center, guide pin 63, one end of which is connected to pusher plate 21 and the opposite end of which is inserted into the inside of main body 61 through the hole of block 62, compressing spring 64 provided between pusher plate 21 and block 62, and sensor 65 provided at the rear end of main body 61. Thus, buffer section 22 has a buffer function to absorb a pushing force when pusher plate 21 pushes wafer 40. Sensor 65 is a photo interrupter, for example. When a pushing force acting on pusher plate 21 becomes abnormally large and the rear end (end in main body 61) of guide pin 64 passes a specified position, sensor 65 detects the passage and produces a signal. This signal is output to alarm buzzer 66, for example and thereby buzzer 66 is put into action.

The operation of the transfer apparatus constructed as described will now be described in the following. First, this apparatus is installed between the end of the transfer path for transferring semiconductor wafers that have undergone specified processes and wafer cassette 50.

Then, the connecting position of arm 10 with auxiliary mechanism 20 is set to suit the shape of wafer 40 and arm 10 and auxiliary mechanism 20 are connected. In setting the connecting position, arm 10 is moved along guide 3 and set at a position where a specified one of holes 25 coincides with pin 13 of air cylinder 14. Under this condition, the air pressure in air cylinder 14 is increased, thereby making pin 13 protrude and go into the specified hole. Thus, auxiliary mechanism 20 and arm 10 are connected in a specified positional relation between them. Then, by decreasing the air pressure of air cylinder 30 to retract pin 31, the connection of auxiliary mechanism 20 with base plate 1 is released. Arm 10 is now movable along guide 3 and the transfer of semiconductor wafers 40 is started.

Semiconductor wafer 40 that has passed the transfer path and reached the transfer apparatus is placed on the end portion of arm 10, aligned in a suitable position by an aligning device (not shown) that has risen through hole 15 and is held by hole 16 of arm 10 by the work of vacuum pump 18.

Arm 10 having wafer 40 placed thereon is moved toward wafer cassette 50 as a transferred position by the turning of timing belt 7 which is caused by driving motor 4. In this way, wafer 40 is transferred into wafer cassette 50.

Figure 4A:
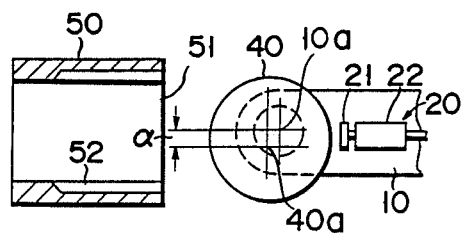
FIGS. 4A through 4D are views to explain the motions of the arm, auxiliary mechanism and the semiconductor wafer when the wafer is transferred into a wafer cassette.

This transferring action will now be described with reference to FIGS. 4A through 4D. In FIG. 4A, semiconductor wafer 40 is placed on arm 10 with wafer center 40a displaced by α in the direction perpendicular to the wafer moving direction from a center line 10a of arm 10.

Figure 4B:
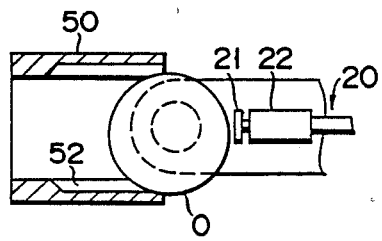

In the step of moving arm 10 to wafer cassette 50 in this state, semiconductor wafer 40 comes into contact with the point 0 of entrance 51 of cassette 50 (FIG. 4B). As the arm is moved further, semiconductor wafer 40 moves some distance with its peripheral portion being in contact with the wall of storing groove 52 of wafer cassette 50. Finally, wafer 40 is stopped by the pushing force from the wall of storing groove 52 acting on wafer 40.

Figure 4C:
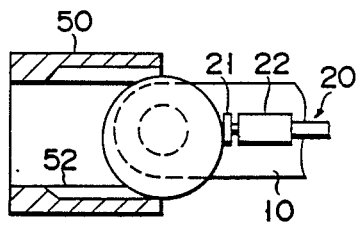
Figure 4D:
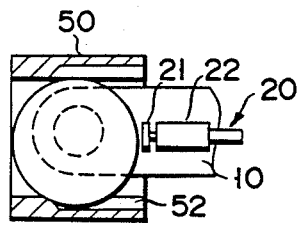

Under this condition, wafer 40 does not move, but arm 10 and auxiliary mechanism 20 move in the transfer direction and therefore, pusher plate 21 of auxiliary mechanism 20, which is standing by at a short distance from wafer 40, touches wafer 40 (FIG. 4C). As auxiliary mechanism 20 moves with arm 10, pusher plate 21 presses wafer 40, to thereby apply wafer 40 with a force which acts in such a manner to rotate wafer 40, thus rotating wafer 40 substantially around hole 16, thereby substantially eliminating the displacement α. Thus, wafer 40 is guided by the wall of storing groove 52 and stored in a predetermined position of wafer cassette 50. As described above, since the pushing action of auxiliary mechanism 20 has a function to correct the position of wafer 40, a wafer 40 can be readily stored in a wafer cassette 50, and secured in a predetermined storing position. Therefore, it is possible to increase the speed of the transfer process. Further, since a torque is applied to wafer 40 by auxiliary mechanism 20 thereby moving wafer 40 an avoidable direction, a force applied to wafer 40 by wafer cassette 50 is relatively small. As a result, there are less chances for wafer 40 to be damaged by contact with wafer cassette 50. To this end, it is only necessary to provide an auxiliary mechanism 20 to push a wafer. This makes the construction of the transfer apparatus simpler and makes it easy to put this invention into practical application.

Buffer section 22 has a buffering function to absorb the pushing force when pusher plate 21 pushes wafer 40. However, if an abnormal pushing force exceeding the force of compression spring 64 of buffer section 21 is applied to pusher plate 21, that is, if an abnormally large pushing force is applied to wafer 40, guide pin 64 moves in the direction opposite to the wafer moving direction. When the rear end of guide pin reaches the acting position of sensor 65 (photo interrupter), this is detected by sensor 65 and a detection signal is output to alarm buzzer 66 which is thereby put into action. Therefore, by immediately stopping the operation of the transfer apparatus when the buzzer is actuated, wafer 40 can be prevented from being damaged. This ensures a very high safety of semiconductor wafers in the transferring process.

Pusher plate 21 may have concave or convex surface as well as plane surface.

As described earlier, semiconductor wafer 40 is vacuum-chucked to arm 10. Semiconductor wafer 40 cannot be easily moved due to an excessive chucking force which occurs with some types of wafer or which may be owing to the loading condition of the wafer. In such a case, when wafer 40 is to be transferred to wafer cassette 50, wafer 40 does not move even though auxiliary mechanism 20 pushes it and the position of wafer 40 cannot be corrected effectively.

To cope with the case just described, it is only necessary to contrive a means to vary the chucking force to attach wafer 40 to arm 10 and thereby reduce the chucking force just before wafer 40 is transferred into wafer cassette 50.

Figure 5:
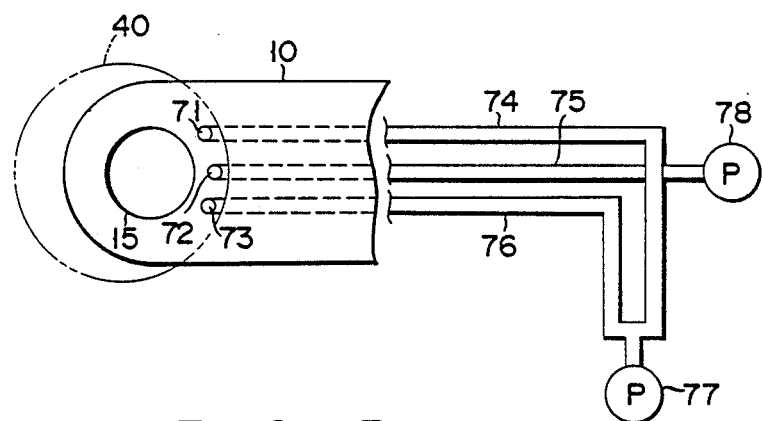
FIG. 5 is a view to explain the chucking mechanism which is capable of varying the chucking force when a semiconductor wafer is attached to the arm.

A practical example of mechanism capable of reducing the chucking force is shown in FIG. 5. FIG. 5 shows arm 10 formed with three holes 71, 72 and 73 therein for chucking in addition to the hole 15 for alignment. Holes 71 and 73 communicate with pipes 74 and 76, respectively, which in turn are both connected to vacuum pump 77. Hole 72 in the middle communicates with pipe 75 which is connected to vacuum pump 78. In other words, there are two separate vacuum-chucking systems.

In such a mechanism, during the time from when wafer 40 is loaded on arm 10 to when wafer 40 comes to the entrance of wafer cassette 50, both vacuum pumps 77 and 78 are operated to hold wafer 40 with chucking holes 72, 73 and 74. To transfer wafer 40 into wafer cassette 50, vacuum pump 77 is stopped and only vacuum pump 78 is operated to hold wafer 40 with chucking hole 72 only. By this operation, it is possible to reduce the chucking force applied to wafer 40 when wafer 40 is transferred into wafer cassette 50. In this way, auxiliary mechanism 20 can very easily and securely transfer wafer 40 into wafer cassette 50.

Even when auxiliary mechanism 20 is not used, varying the chucking force brings about notable effects. That is, since the chucking force applied to wafer 40 in transferring it into wafer cassette 50 is fairly small, wafer 40 can move with ease even if wafer 40 touches the internal wall of wafer cassette 50. Hence, wafer 40 can be inserted to a specified position of wafer cassette 50 with high probability and chances of wafer 40 being broken can be minimized. The operation of such a transfer apparatus is simple in that one of the two vacuum pumps is simply turned on and off.

This invention is not limited to the embodiment described above. For example, auxiliary mechanism 20 can be replaced by a mechanism which pushes a wafer, either after the wafer has contacted the side wall of the wafer cassette 50 or after the wafer has been displaced. The movement of the pusher plate of this auxiliary mechanism is not limited to a continuous one; the plate may be moved either intermittently or pulsatively. Further, the invention may be embodied in various forms including a transfer apparatus which employs no more than a stopper device to correct the position of the wafer and another apparatus which employs ultrasonic waves to vibrate a wafer when it is inserted into a wafer cassette.

Description has been made using a semiconductor wafer as an article to be transferred but other plate materials such as masks, reticles, substrates and liquid crystal glass plates may be handled according to this invention.

In the above embodiment, a photo interrupter is used for the sensor to detect the position of a wafer, but other types of sensors such as a pressure sensor may be used. When a pressure sensor is used, the transfer apparatus should be configured such that the sensor is pushed by the rear end of the guide pin when an abnormal pressure is applied to the auxiliary mechanism.

The mechanism to vary the chucking force by which to hold a wafer need not be limited to the construction described above and the vacuum pump may be designed to have a variable displacement.

Various changes and modifications may be made in the invention without departing from the spirit and scope thereof.

What is claimed is:

1. A plate-like member transfer apparatus for transferring a plate-like member into a storage/guide unit having an entrance for the plate-like member, the entrance being defined by two side walls of the storage/guide unit, said apparatus comprising:
supporting means for supporting the plate-like member thereon such that the plate-like member is movable in response to a force applied thereto;
moving means for moving said supporting means to said storage/guide unit to thereby transfer said plate-like member into said storage/guide unit; and
adjusting means, which is moved to said storage/guide unit together with said supporting means by said moving means, for pressing against the plate-like member when the plate-like member contacts at least one of the side walls of the storage/guide unit, wherein the combination of said adjusting means, said moving means, said supporting means, and said at least one of the side walls rotates said plate-like member to a position in which said plate-like member is aligned with the entrance of said storage/guide unit, thereby fitting the plate-like member into the entrance of the storage/guide unit.

2. The plate-like member transfer apparatus according to claim 1, wherein said adjusting means has a pushing plate which moves with the movement of said supporting means and which pushes said plate-like member when said plate-like member comes into contact with the side walls of said storage/guide unit.

3. The plate-like member transfer apparatus according to claim 2, where in said adjusting means comprises a buffer section to lessen the reaction force from the plate-like member acting on said pushing plate.

4. The plate-like member transfer apparatus according to claim 1, wherein said supporting means has vacuum absorbing means which acts on said plate-like member, said vacuum absorbing means having an absorbing section and attracting means to attract the plate-like member at an absorbing portion.

5. The plate-like member transfer apparatus according to claim 4, wherein said absorbing section comprises first and second absorbing holes, said attracting means comprises a first vacuum pump communicating with said first absorbing hole and a second vacuum pump communicating with said second absorbing hole, either one of the first and second vacuum pump being stopped when a plate-like member is carried into said storage/guide unit, thereby decreasing the chucking force holding the plate-like member.

6. The plate-like member transfer apparatus according to claim 2, wherein said supporting means comprises a connecting member and said adjusting means comprises a connected member, said adjusting means being fixed to said supporting means by connecting said connecting member with said connected member and removed from said supporting means by releasing this connection.

7. The plate-like member transfer apparatus according to claim 5, wherein said vacuum absorbing means absorbs the plate-like member by use of one absorbing hole when the plate-like member reaches a position adjacent the storage/guide unit.

8. The plate-like transfer apparatus according to claim 1, wherein said plate-like member is a semiconductor wafer.

9. The plate-like member transfer apparatus according to claim 3, wherein said buffer section has a main body, a buffering member provided between said main body and said pusher plate and used to absorb the reaction force from the plate like member and a sensor to detect the movement of the pusher plate to a specified position caused by the reaction force when this has occurred.

10. The plate-like member transfer apparatus according to claim 9, wherein said buffering member has a compression spring.

11. The plate-like member transfer apparatus according to claim 9, further comprising an alarm means which is actuated in response to a detection signal from said sensor.

12. The plate-like member transfer apparatus according to claim 6, wherein the connected member has a plurality of connecting parts, any of said connecting parts being connectable to said connecting member.

13. The plate-like member transfer apparatus according to claim 1, wherein said moving means has a motor and transmission means to transmit the rotation of the motor to said supporting means.

14. A plate-like member transfer apparatus for transferring a plate-like member into a storage/guide unit having an entrance for the plate-like member, the entrance being defined by two side walls of the storage/guide unit, said apparatus comprising:
  supporting means for supporting a plate material thereon; and
  moving means for moving said supporting means to the storage/guide unit,
  wherein said supporting means comprises vacuum absorbing means for causing a plate-like member to be removably attached to said supporting means, and said absorbing means is capable of decreasing the absorbing force needed to hold said plate-like member when the plate-like member is carried to a position adjacent said storage/guide unit an adjusting means, which is moved to said storage/guide unit together with said supporting means by said moving means for pressing against the plate like member when the plate-like member contacts at least one of the side walls of the storage/guide unit, wherein the combination of said adjusting means, said moving means, said supporting means, and said at least one of the side walls rotates said plate-like member, when said absorbing force is decreased, to a position in which said plate-like member is thereby aligned with the entrance of said storage/guide unit, thereby fitting the plate-like member into the entrance of the storage/guide unit.

15. The plate-like member transfer apparatus according to claim 14, wherein said vacuum absorbing means has an absorbing section and attracting means to attract said plate-like member at said absorbing means.

16. The plate-like member transfer apparatus according to claim 15, wherein said absorbing section comprises first and second absorbing holes and said attracting means comprises a first vacuum pump communicating with said first absorbing hole and second vacuum pump communicating with said second absorbing hole, either one of said first and second vacuum pump being stopped when a plate-like member is carried to a position adjacent said storage/guide unit, thereby decreasing the absorbing force needed to hold the plate-like member.

17. The plate-like member transfer apparatus according to claim 16, wherein said vacuum absorbing means absorbs the plate-like member by use of one absorbing hole when the plate like member reaches a point adjacent the storage/guide unit.

* * * * *